United States Patent
Schwarzenbach et al.

(10) Patent No.: US 10,957,577 B2
(45) Date of Patent: Mar. 23, 2021

(54) METHOD FOR FABRICATING A STRAINED SEMICONDUCTOR-ON-INSULATOR SUBSTRATE

(71) Applicant: Soitec, Bernin (FR)

(72) Inventors: Walter Schwarzenbach, Saint Nazaire les Eymes (FR); Guillaume Chabanne, Le Touvet (FR); Nicolas Daval, Goncelin (FR)

(73) Assignee: SOITEC, Bernin (FR)

( * ) Notice: Subject to any disclaimer, the term of this patent is extended or adjusted under 35 U.S.C. 154(b) by 289 days.

(21) Appl. No.: 16/301,276

(22) PCT Filed: May 17, 2017

(86) PCT No.: PCT/EP2017/061793
§ 371 (c)(1),
(2) Date: Nov. 13, 2018

(87) PCT Pub. No.: WO2017/198687
PCT Pub. Date: Nov. 23, 2017

(65) Prior Publication Data
US 2020/0321243 A1    Oct. 8, 2020

(30) Foreign Application Priority Data

May 17, 2016    (FR) ...................................... 1654369

(51) Int. Cl.
*H01L 21/00* (2006.01)
*H01L 21/762* (2006.01)

(52) U.S. Cl.
CPC .. *H01L 21/76275* (2013.01); *H01L 21/76254* (2013.01)

(58) Field of Classification Search
CPC ......... H01L 21/76275; H01L 21/76254; H01L 21/76289
See application file for complete search history.

(56) References Cited

U.S. PATENT DOCUMENTS

| 6,830,962 B1* | 12/2004 | Guarini | ............ H01L 21/76267 438/149 |
| 2004/0173790 A1* | 9/2004 | Yeo | .................. H01L 21/76254 257/19 |

(Continued)

FOREIGN PATENT DOCUMENTS

EP    1443550 A1    8/2004

OTHER PUBLICATIONS

Taiwan Office Action for TW Application No. 106116265 dated Jul. 21, 2020, 7 pages.

(Continued)

*Primary Examiner* — Richard A Booth
(74) *Attorney, Agent, or Firm* — TraskBritt

(57) ABSTRACT

A method for fabricating a strained semiconductor-on-insulator substrate comprises bonding a donor substrate to a receiving substrate with a dielectric layer at the interface. The donor substrate comprises a monocrystalline carrier substrate, an intermediate etch-stop layer, and a monocrystalline semiconductor layer. The monocrystalline semiconductor layer is transferred from the donor substrate to the receiving substrate. Trench isolations are formed to cut a portion from a layer stack including the transferred monocrystalline semiconductor layer, the dielectric layer, and the strained semiconductor material layer. The cutting operation results in relaxation of strain in the strained semiconductor material, and in application of strain to the transferred monocrystalline semiconductor layer. After transferring the monocrystalline semiconductor layer and before the cutting operation, a portion of the carrier substrate is selectively etched with respect to the intermediate layer, and the intermediate layer is selectively etched with respect to the monocrystalline semiconductor layer.

18 Claims, 9 Drawing Sheets

(56) References Cited

U.S. PATENT DOCUMENTS

| | | |
|---|---|---|
| 2004/0256700 A1 | 12/2004 | Doris et al. |
| 2005/0153524 A1 | 7/2005 | Maa et al. |
| 2005/0236687 A1* | 10/2005 | Chan ..................... H01L 21/84 257/482 |
| 2014/0225160 A1 | 8/2014 | Clifton et al. |
| 2019/0181035 A1* | 6/2019 | Schwarzenbach ........................... H01L 21/76254 |

OTHER PUBLICATIONS

International Written Opinion for International Application No. PCT/EP2017/061793 dated Aug. 28, 2017, 6 pages.
International Search Report for International Application No. PCT/EP2017/061793 dated Aug. 28, 2017, 3 pages.

* cited by examiner

METHOD FOR FABRICATING A STRAINED SEMICONDUCTOR-ON-INSULATOR SUBSTRATE

CROSS-REFERENCE TO RELATED APPLICATIONS

This application is a national phase entry under 35 U.S.C. § 371 of International Patent Application PCT/EP2017/061793, filed May 17, 2017, designating the United States of America and published in English as International Patent Publication WO 2017/198687 A1 on Nov. 23, 2017, which claims the benefit under Article 8 of the Patent Cooperation Treaty to French Patent Application Serial No. 1654369, filed May 17, 2016.

TECHNICAL FIELD

The present disclosure relates to a method for fabricating a strained semiconductor-on-insulator substrate.

BACKGROUND

For digital applications, in particular, for technological nodes beyond the 22 nm node, materials with enhanced charge carrier mobility are sought.

Among these materials, FDSOI (acronym for fully depleted silicon-on-insulator) substrates feature a very thin (i.e., typically less than 50 nm thick) layer of silicon on a buried electrically insulating layer, the silicon layer potentially being used to form the channel of a CMOS transistor.

Strained silicon-on-insulator (sSOI) has been identified as a solution allowing the mobility of charge carriers in the silicon layer to be enhanced and good performance thereof has been demonstrated.

Various fabrication methods are known.

Document US 2014/0225160 discloses, in particular, a method allowing at least part of a strain present in a silicon-germanium layer located on the surface of a receiving substrate to be transferred to an initially relaxed silicon layer bonded to the receiving substrate via a dielectric layer that is intended to form the buried insulating layer of the SOI. This strain transfer occurs when a portion of the stack is cut by means of trenches that extend into the receiving substrate at least beyond the strained silicon-germanium layer. Thus, a relaxation of the compressive strain of the silicon-germanium layer is at least partially transmitted in the form of a tensile strain of the silicon layer.

Based on this principle, an sSOI substrate can be manufactured according to the following steps:
- a donor substrate 1 comprising a monocrystalline silicon layer 10 covered by a silicon oxide layer 13 is provided (cf. FIG. 1A);
- ionic species are implanted into the donor substrate 1 so as to form a weakened zone 14 allowing a silicon layer 12 to be transferred to be defined (cf. FIG. 1B);
- a receiving substrate 2 comprising a surface layer 20 of silicon-germanium under compressive strain is provided (cf. FIG. 1C);
- the donor substrate 1 is bonded to the receiving substrate 2, the silicon oxide layer 13—which is intended to form the buried insulating layer of the sSOI substrate—and the strained silicon-germanium layer 20 being at the bonding interface (cf. FIG. 1D);
- the monocrystalline silicon layer 12 is transferred to the receiving substrate 2 by detaching the donor substrate along the weakened zone 14 (cf. FIG. 1E);
- trenches T are formed around a portion of the stack consisting of the strained silicon-germanium layer 20, the buried oxide layer 13 and the transferred semiconductor layer 12, the trenches extending into the receiving substrate 2 beyond the strained silicon-germanium layer 20 (cf. FIG. 1F).

The cutting operation results in the at least partial relaxation of the silicon-germanium and the transmission of at least part of the strain to the transferred silicon layer in the portion, thus allowing the strained semiconductor-on-insulator substrate, denoted by sSOI, to be formed.

For FDSOI technologies, it is necessary for the surface of the strained silicon layer to exhibit a high degree of roughness and for the thickness of the layer to be highly uniform. Thus, typically, the roughness of the surface as characterized by atomic force microscopy should have an RMS value of less than 1 Å over a field of measurement of 30×30 $\mu m^2$. The uniformity of the intra-wafer thickness (i.e., the thickness within one and the same substrate) as characterized by ellipsometry should correspond to a thickness kept within 5 Å of the target mean thickness at any point on the surface of the substrate.

To achieve this, a step of finishing the transferred monocrystalline silicon layer with a view to decreasing its roughness and to thinning it in order to obtain the desired thickness should be implemented after the transfer of the layer to the receiving substrate and before the formation of the trenches.

Conventional thermal smoothing techniques cannot be used on an sSOI substrate containing a silicon-germanium layer. Specifically, the heat treatment used would cause a portion of the germanium to diffuse out of the silicon-germanium layer, resulting in a loss of effectiveness in transferring strain from the layer to the transferred monocrystalline silicon layer.

Furthermore, chemical-mechanical polishing is not compatible given the current state of the art on the subject with the desired uniformity of thickness.

BRIEF SUMMARY

One aim of the present disclosure is to design a method for fabricating a strained semiconductor-on-insulator substrate that allows the uniformity and roughness required for the strained semiconductor layer to be obtained without a loss of effectiveness in transferring strain.

According to the present disclosure, a method is proposed for fabricating a strained semiconductor-on-insulator substrate, comprising:
(a) providing a donor substrate comprising a monocrystalline semiconductor layer;
(b) providing a receiving substrate comprising a surface layer of a strained monocrystalline semiconductor material;
(c) bonding the donor substrate to the receiving substrate, a dielectric layer being at the interface;
(d) transferring the monocrystalline semiconductor layer from the donor substrate to the receiving substrate;
(e) cutting, by means of trench isolations extending into the receiving substrate beyond the strained semiconductor material layer, a portion from a stack formed from the transferred monocrystalline semiconductor layer, from the dielectric layer and from the strained semiconductor material layer, the cutting operation resulting in the relaxation of the strain in the strained semiconductor material, and in the application of at least a part of the strain to the transferred monocrystalline semiconductor layer;

the method being characterized in that:

the donor substrate provided in step (a) comprises, in succession, a monocrystalline carrier substrate, an intermediate layer and the monocrystalline semiconductor layer, the intermediate layer forming an etch-stop layer with respect to the carrier substrate material and to the material of the monocrystalline semiconductor layer, step (d) comprising the transfer, to the receiving substrate, of the monocrystalline semiconductor layer, of the intermediate layer and of a portion of the carrier substrate; and between steps (d) and (e), a first operation of selectively etching the portion of the carrier substrate with respect to the intermediate layer and a second operation of selectively etching the intermediate layer with respect to the monocrystalline semiconductor layer are implemented.

The present text is concerned with the strain in a plane parallel to the main surface of the layers in question.

The use of a donor substrate comprising multiple layers of different chemical compositions that may be selectively etched in succession makes it possible to avoid having to use annealing for the purpose of smoothing in order to obtain the uniformity and roughness desired for the strained semiconductor layer of the final substrate.

According to advantageous features of the disclosure, taken alone or in combination as appropriate:

the donor substrate is formed by epitaxy, on the monocrystalline carrier substrate, of the intermediate layer then of the monocrystalline semiconductor layer;

the carrier substrate comprises a first material that is identical to that of the monocrystalline semiconductor layer and the intermediate layer comprises a second material that differs from the first material, the thickness of the intermediate layer being chosen so that the second material retains the lattice parameter of the first material;

the monocrystalline semiconductor layer is made of silicon and the intermediate layer is made of silicon-germanium;

the thickness of the intermediate layer is between 5 nm and 20 nm;

the strained semiconductor material layer comprises silicon-germanium;

the strained semiconductor layer is formed by epitaxy on a base substrate made of silicon;

upon completion of step (d), the thickness of the dielectric layer included between the transferred monocrystalline semiconductor layer and the strained semiconductor material layer is less than or equal to 50 nm, preferably less than or equal to 25 nm;

step (a) comprises an operation of implanting ionic species into the donor substrate so as to form a weakened zone extending into the carrier substrate, and step (d) comprises the detachment of the donor substrate along the weakened zone, so as to transfer the monocrystalline semiconductor layer, the intermediate layer and a portion of the carrier substrate to the receiving substrate;

step (b) additionally comprises the formation, on the strained semiconductor material layer of the receiving substrate, of a dielectric bonding layer or of a bonding layer consisting of the same relaxed monocrystalline material as the monocrystalline semiconductor layer of the donor substrate; and in step (c), the bonding layer is at the bonding interface between the donor substrate and the receiving substrate;

the donor substrate comprises a first dielectric layer on the monocrystalline semiconductor layer;

according to one embodiment, the bonding layer formed on the receiving substrate is a second dielectric layer, the first dielectric layer and second dielectric layer together forming a buried electrically insulating layer of the strained semiconductor-on-insulator substrate;

the bonding layer comprises an oxide or a nitride of a semiconductor material;

the bonding layer is formed by deposition on the strained semiconductor material layer of the receiving substrate;

the thickness of the bonding layer is between 1 nm and 30 nm;

according to another embodiment, the bonding layer is formed by epitaxy of the same semiconductor material as the monocrystalline semiconductor layer on the strained semiconductor material layer;

the thickness of the bonding layer is between 1 nm and 20 nm.

BRIEF DESCRIPTION OF THE DRAWINGS

Other features and advantages of the disclosure will emerge from the detailed description that follows, with reference to the accompanying drawings in which.

Figure 1A:
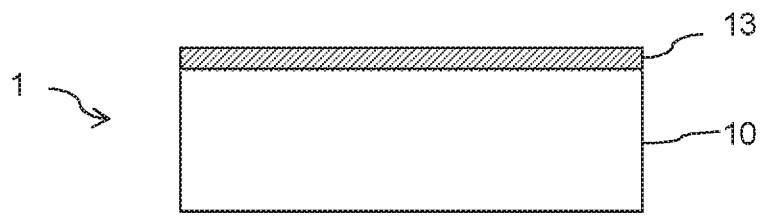
FIGS. 1A to 1F schematically illustrate steps of a method for fabricating a strained silicon-on-insulator substrate leading to overly high defectivity.
Figure 1B:
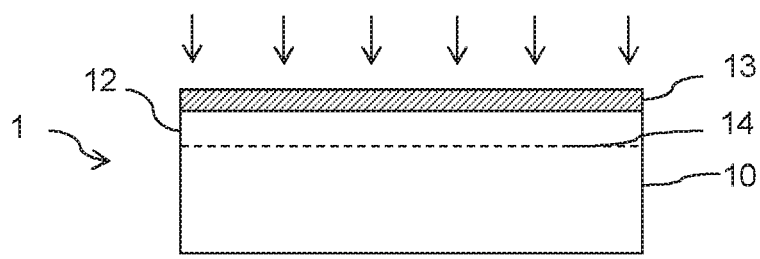
Figure 1C:
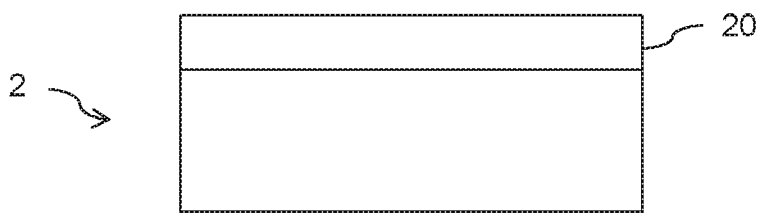
Figure 1D:
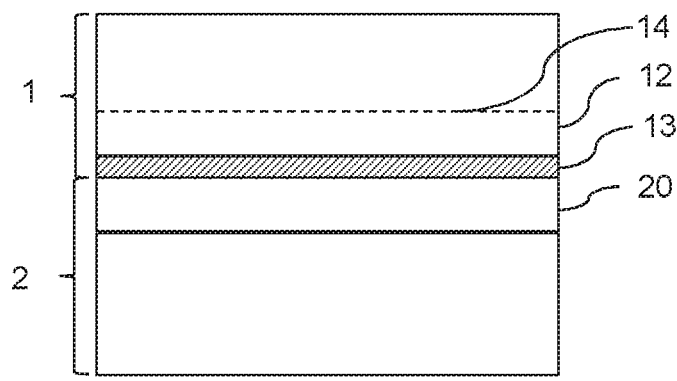
Figure 1E:
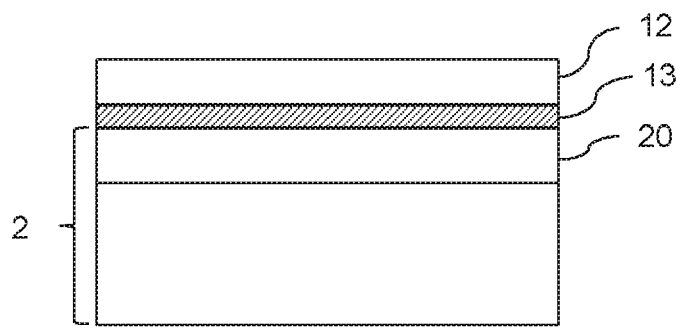
Figure 1F:
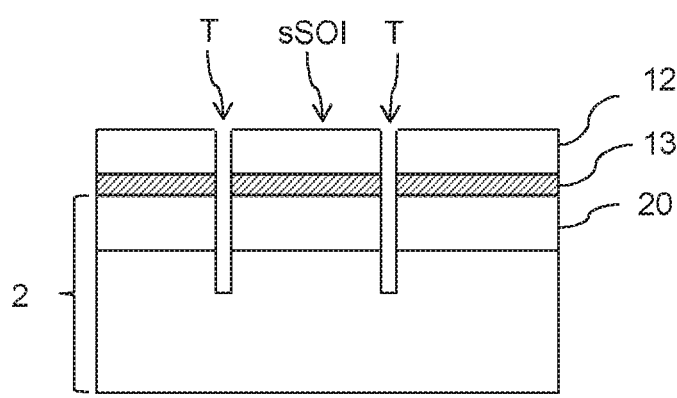

In order to facilitate the readability of the figures, the various layers are not shown to scale.

DETAILED DESCRIPTION

A donor substrate is provided that comprises at least one monocrystalline semiconductor layer that is intended to form the strained layer of the sSOI substrate.

The donor substrate is a composite substrate, i.e., it consists of at least two layers of different materials, including the monocrystalline semiconductor layer, which is arranged on the surface of the substrate.

More specifically, the donor substrate comprises, in succession, a monocrystalline carrier substrate, an intermediate layer and the monocrystalline semiconductor layer, the intermediate layer forming an etch-stop layer with respect to the material of the carrier substrate and to the material of the monocrystalline semiconductor layer. To achieve this, the intermediate layer is made of a material having a chemical composition that differs from that of the carrier substrate and of the monocrystalline semiconductor layer, the choice of materials potentially being made according to the nature of the etching agent and the desired selectivity.

In a particularly advantageous manner, the donor substrate is formed by epitaxy, on the monocrystalline carrier substrate, of the intermediate layer, then of the monocrystalline semiconductor layer. Epitaxy is indeed the most suitable technique for forming a monocrystalline semiconductor layer of high quality and controlled thickness, with respect to the levels of performance expected for the layer in the sSOI substrate. In particular, the roughness of the monocrystalline semiconductor layer and the uniformity of its thickness, required for the final sSOI substrate, are obtained directly by means of epitaxy rather than subjecting the layer to a subsequent treatment.

According to one preferred embodiment, the donor substrate comprises a first material that is identical to that of the monocrystalline semiconductor layer and the intermediate layer comprises a second monocrystalline material that differs from the first material.

The thickness of the intermediate layer is chosen so that it is thin enough for the second material to retain the lattice parameter of the first material, such that the monocrystalline semiconductor layer formed on the intermediate layer is in the relaxed state and that the strain generated in the second material due to the difference in lattice parameter is not released, which would produce crystal defects such as dislocations. Thus, the thickness of the intermediate layer is typically between 5 nm and 20 nm. This size limit will have to be reviewed in the case of an intermediate layer offering selectivity in terms of chemical etching without causing strain due to the difference in lattice parameter of the crystal in question.

According to one particular form of execution of the disclosure, the monocrystalline semiconductor layer is made of silicon and the intermediate layer is made of silicon-germanium, the germanium content of the intermediate layer being of the order of 20%.

Alternatively, the monocrystalline semiconductor layer may be made of germanium, or else of silicon-germanium.

The thickness of the monocrystalline semiconductor layer is advantageously between 5 nm and 50 nm, preferably between 10 nm and 30 nm.

According to one embodiment, the monocrystalline semiconductor layer is covered by a dielectric layer. The dielectric layer may be, in particular, a layer of an oxide or of a nitride of a semiconductor material.

For example, if the monocrystalline layer is a silicon layer, the dielectric layer may be a silicon oxide ($SiO_2$) layer.

The dielectric layer will form all or part of the buried insulating layer of the strained semiconductor-on-insulator substrate.

Alternatively, the monocrystalline semiconductor layer is not covered by such a dielectric layer and it is the free surface thereof that forms the surface of the donor substrate. In this case, as explained below, the buried insulating layer of the sSOI substrate will consist of a dielectric layer formed on the receiving substrate to which the donor substrate will be bonded with a view to the transfer of the monocrystalline semiconductor layer.

A receiving substrate that comprises a surface layer of a strained semiconductor material is also provided. The layer may be formed by epitaxy on a base substrate having a lattice parameter that differs from that of the material of the strained layer.

The strain in this layer may be, depending on the materials used and on the nature of the strain to which it is desired to subject the semiconductor layer of the strained semiconductor-on-insulator substrate, compressive or tensile.

For example, the strained semiconductor material layer may be a silicon-germanium layer, formed by epitaxy on a silicon base substrate. The germanium content of the layer is typically of the order of 20% to 40%, although these values are not limiting, the choice thereof potentially being made according to the thickness of the layer. In this case, the strain in the silicon-germanium layer is compressive.

In order to form the strained semiconductor-on-insulator substrate, the monocrystalline semiconductor layer of the donor substrate should be transferred to the receiver substrate, this transfer comprising an operation of bonding the donor substrate to the receiver substrate, the monocrystalline semiconductor layer of the donor substrate and the strained semiconductor material layer being located on the bonding interface side.

According to one embodiment, the transfer involves the SMART CUT® method. In a manner known per se, this transfer comprises:

prior to the bonding operation, ionic species are implanted into the donor substrate so as to form a weakened zone allowing a portion of the donor substrate to be defined that comprises not only the monocrystalline semiconductor layer to be transferred but also the intermediate layer and part of the carrier substrate;

after the bonding operation, the donor substrate is detached along the weakened zone.

The conditions of implementation of such a method are known to those skilled in the art and, as such, will not be described in detail in the present text.

After the transfer, the transferred part of the donor substrate undergoes a finishing treatment allowing residual defects linked to the transfer process to be removed and the transferred monocrystalline semiconductor layer to be smoothed and thinned to the desired thickness.

This finishing treatment comprises two etching steps:

a first operation of etching the part of the carrier substrate that is located on the surface of the structure obtained upon completion of the transfer, the etching operation being selective with respect to the material of the intermediate layer. For example, if the carrier substrate is made of silicon and the intermediate layer is made of silicon-germanium, the etching agent may be based on TMAH.

a second operation of etching the intermediate layer that is located on the surface of the structure obtained upon completion of the first operation of etching the carrier substrate, the second etching operation being selective with respect to the material of the monocrystalline semiconductor layer. For example, if the intermediate layer is made of silicon-germanium and the monocrystalline semiconductor layer is made of silicon, the etching agent may be based on $CH_3COOH$.

A person skilled in the art is capable of determining the appropriate agent for each of the two etching operations and the conditions of implementation according to the nature of the materials in question. Furthermore, the disclosure is not limited to selective wet etching but may also involve selective dry etching.

Lastly, a portion of the stack consisting of the transferred semiconductor layer, of the buried insulating layer (which is formed, as disclosed above, from the bonding layer and/or from a dielectric layer of the donor substrate) and of the strained semiconductor material layer is cut in order to form the sSOI substrate.

The cutting operation is advantageously carried out by etching trench isolations around the portion. In order to allow the relaxation of the strained semiconductor material layer to be optimally transmitted to the transferred monocrystalline semiconductor layer, the trenches should extend into the thickness of the receiving substrate beyond the strained semiconductor material layer. The technique for fabricating the trenches is well known to those skilled in the art and as such does not need to be described in detail in the present text.

According to one embodiment that is an alternative to the SMART CUT® method, the transfer involves thinning the donor substrate on its back face, i.e., the face opposite the bonding interface. As is well known, such a thinning operation may involve one or more steps of dry or wet etching and/or polishing, especially chemical-mechanical polishing, etc. In this case, this method is carried out via the two selective etching steps described above.

The disclosure is not limited with respect to the transfer technique used.

The advantage of this finishing treatment is that it allows a transferred monocrystalline semiconductor layer to be obtained that exhibits uniform thickness and a low degree of roughness—due to the layer being fabricated by epitaxy—without involving a thermal budget that is liable to relax the strain in the layer of the receiving substrate. In particular, if the strained layer of the receiving substrate is made of silicon-germanium, the absence of such a thermal budget makes it possible to avoid the diffusion of the germanium out of the strained layer.

Figure 2:
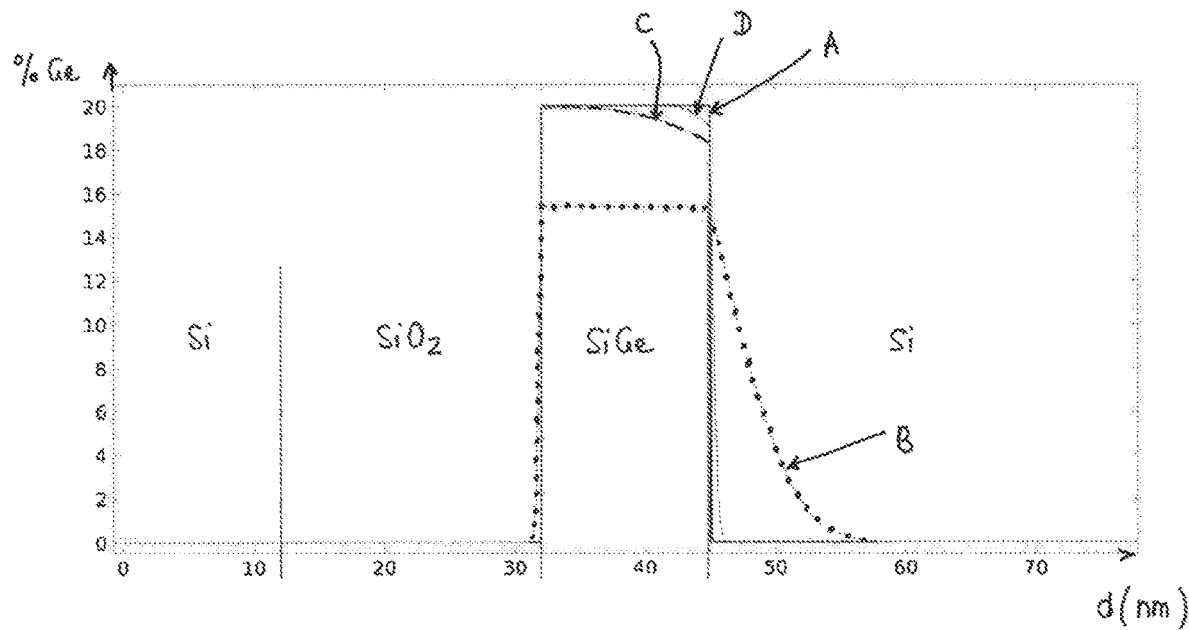
FIG. 2 is a graph showing the germanium content of the various layers of an sSOI substrate for various method conditions.

This effect can be seen in FIG. 2, which is a graph showing the germanium content within a structure comprising, in order of increasing depth d (in nm):
- a transferred layer of monocrystalline silicon;
- a buried insulating layer of silicon oxide;
- a strained layer of silicon-germanium having a germanium content of 20%;
- a silicon base substrate.

Curves B to D show the germanium content, in terms of percentage of the composition of each layer of the structure, for various thermal budgets applied to the structure.

Curve A shows the germanium content of the initial structure. As expected, the germanium content of the SiGe layer is constant throughout its thickness and the germanium content of the other layers is zero.

Curve B corresponds to a thermal budget of a finishing treatment implemented conventionally on FDSOI substrates, i.e., using a smoothing process relying on a high thermal budget in order to obtain a final degree of roughness that is equivalent to that of a polished bulk silicon substrate, i.e., of the order of 1 Å RMS as measured by atomic force microscopy over a scan of 30×30 µm². A substantial degree of diffusion of the germanium from the SiGe layer to the subjacent silicon carrier substrate and, to a lesser extent, to the buried oxide layer is observed. The germanium content of the SiGe layer is now only 16%, which corresponds to a substantial decrease in the strain in the layer.

Curve C corresponds to a thermal budget of a finishing treatment implemented conventionally on PD SOI (partially depleted SOI) substrates, i.e., using one or more quick thermal smoothing processes, in order to obtain a final degree of roughness of the order of 2.5 to 3 Å RMS as measured by atomic force microscopy over a scan of 30×30 µm². A degree of diffusion of the germanium from the SiGe layer to the subjacent silicon carrier substrate is observed. The germanium content of the SiGe layer varies from around 20% at the interface with the buried insulating layer to around 18% at the interface with the subjacent silicon carrier substrate, which corresponds to a significant decrease in the strain in the layer.

Curve D corresponds to a thermal budget implemented in the method according to the disclosure as described above. The thermal budget mentioned in this case corresponds to that applied in the detachment annealing process used, as is well known, in the SMART CUT® method. It is observed that the germanium content of the SiGe layer remains substantially identical to that of the initial structure, corresponding to a conservation of the strain in the layer and, consequently, the relaxation of the strain being optimally transmitted to the transferred silicon layer during the formation of the trenches.

According to one advantageous form of execution of the disclosure, the step of bonding the donor substrate to the receiving substrate is preceded by the formation, on the strained semiconductor material layer of the receiving substrate, of a bonding layer allowing materials providing optimum bonding quality in terms of final defectivity to be brought into contact at the bonding interface.

According to one embodiment, the bonding layer is a dielectric layer.

In the case in which the monocrystalline semiconductor layer of the donor substrate is also covered by a dielectric layer (referred to as the first dielectric layer), the bonding interface will consist of the first dielectric layer and of the bonding layer (referred to as the second dielectric layer). The first and second dielectric layers thus together form the buried insulating layer of the final sSOI.

In the case in which the monocrystalline semiconductor layer of the donor substrate is not covered by a dielectric layer, the bonding interface will consist of the monocrystalline semiconductor layer and of the bonding layer. It is then the bonding layer alone that forms the buried insulating layer of the final sSOI.

Advantageously, the bonding layer comprises an oxide or a nitride of a semiconductor material.

The bonding layer is formed by low temperature deposition on the strained semiconductor material layer of the receiving substrate. Any suitable deposition technique may be used. In a non-limiting manner, the vapor phase deposition variants known by the acronyms PE-CVD or PE-ALD may thus be cited.

The thickness of the bonding layer is chosen according to whether a first dielectric layer is present on the monocrystalline semiconductor layer of the donor substrate so as to obtain the desired thickness of the buried insulating layer, which is generally less than or equal to 50 nm, preferably less than or equal to 25 nm.

Advantageously, the thickness is also chosen while taking the thermal budget applied to the receiving substrate during the deposition of the layer into consideration, in order to limit the relaxation of the strain in the strained monocrystalline semiconductor material layer caused by this thermal budget.

The thickness of the bonding layer is typically between 1 nm and 30 nm.

According to another embodiment, the bonding layer consists of the same monocrystalline material, in the relaxed or partially relaxed state, as the monocrystalline semiconductor layer of the donor substrate.

In this case, the monocrystalline semiconductor layer is covered by a dielectric layer that will form the buried insulating layer of the sSOI substrate.

The bonding layer is formed by epitaxy, on the strained monocrystalline semiconductor material layer, of the same semiconductor material as the monocrystalline semiconductor layer of the donor substrate.

The thickness of the bonding layer is advantageously chosen so that it is thin enough to offer the desired level of protection between the SiGe layer and the bonding interface, while taking, as in the preceding embodiment, the thermal budget applied to the receiving substrate during the deposition of the layer into consideration, in order to limit the relaxation of the strain in the strained monocrystalline semiconductor material layer caused by this thermal budget. The thickness also takes into account the removal of material caused by the pre-bonding surface preparation treatment, which may include wet or dry etching.

By way of example, the thickness of such a silicon bonding layer is between 1 nm and 20 nm.

In the two embodiments proposed above, the bonding interface makes either contact between two dielectric layers or contact between a dielectric layer and a layer of the same monocrystalline material, in the relaxed or partially relaxed state, as the monocrystalline semiconductor layer of the donor substrate. These two situations correspond to the bonding configurations that provide minimum final defectivity. Thus, with respect to an sSOI substrate obtained via the method illustrated in FIGS. 1A to 1F with the same cleaning, donor substrate preparation and bonding conditions, an sSOI substrate obtained with a bonding layer on the receiving substrate, such as described above, exhibits, upon visual inspection, a much lower degree of defectivity, which results, in particular, in a substantial decrease in the number of holes corresponding to non-transferred zones of the monocrystalline semiconductor layer.

FIGS. 3A to 3G schematically illustrate steps of the fabrication of a strained semiconductor-on-insulator substrate according to one form of execution of the disclosure.

Figure 3A:
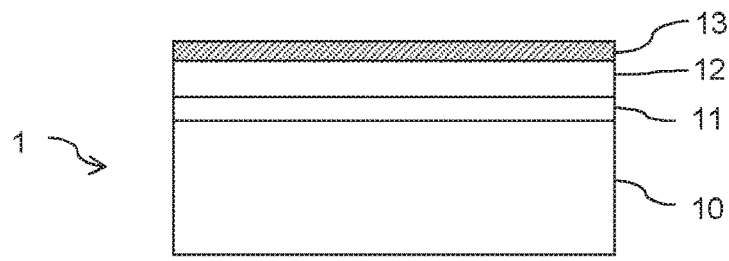
FIGS. 3A to 3I schematically illustrate steps of a method for fabricating a strained semiconductor-on-insulator substrate according to a first embodiment of the disclosure.

FIG. 3A illustrates the provision of the donor substrate 1, which comprises a carrier substrate 10, for example, made of silicon, an intermediate layer 11, for example, made of silicon-germanium, and a monocrystalline semiconductor layer 12, for example, made of silicon.

Furthermore, in the embodiment illustrated in FIG. 3A, the monocrystalline semiconductor layer 12 is covered by a dielectric layer 13.

Figure 3B:
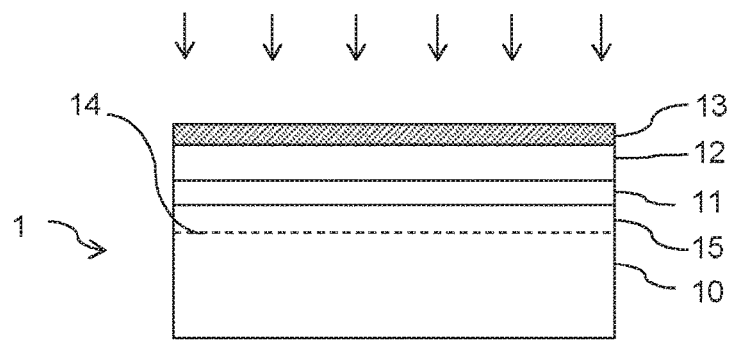

FIG. 3B illustrates the implementation of an implantation of ionic species into the carrier substrate 10 so as to form a weakened zone 14 defining a portion (formed from the silicon layer 13, from the monocrystalline semiconductor layer 12 and from a portion 15 of the carrier substrate) to be transferred by means of the SMART CUT® method. This step is optional, the transfer potentially being carried out by means of a method other than the SMART CUT® method, for example, by thinning the donor substrate on its back face.

Figure 3C:
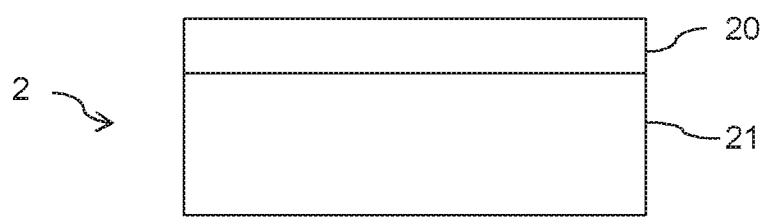

FIG. 3C illustrates the provision of the receiving substrate 2, which comprises a surface of a strained monocrystalline semiconductor material layer 20 on a base substrate 21.

Figure 3D:
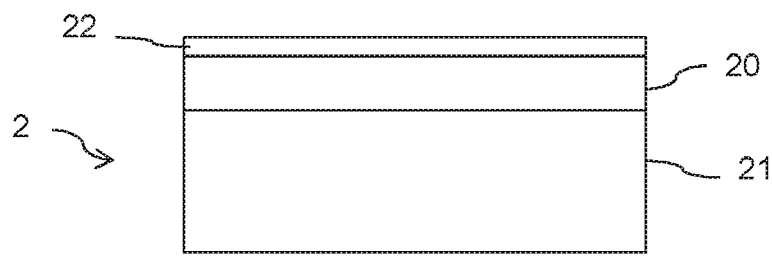

FIG. 3D illustrates an optional, but advantageous, step of forming a bonding layer 22. The bonding layer 22 may consist of a dielectric material deposited on the strained monocrystalline semiconductor material layer 20; alternatively, the bonding layer 22 consists of the same material as that of the dielectric layer 13, in the relaxed or partially relaxed state, formed by epitaxy on the strained monocrystalline semiconductor material layer 20.

Figure 3E:
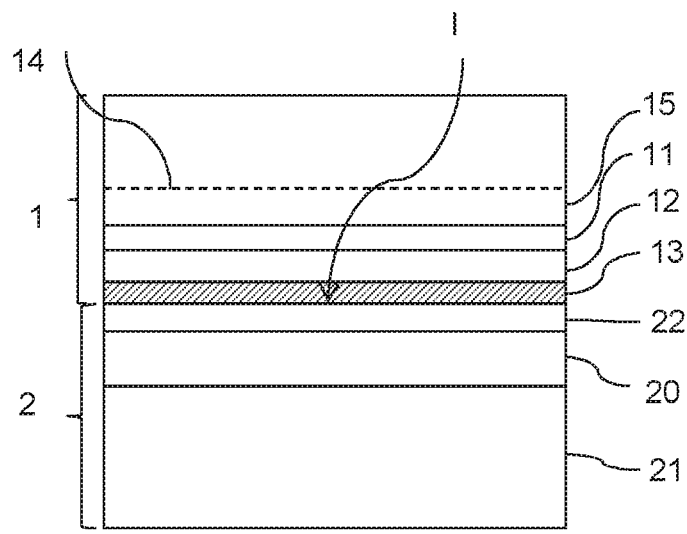

FIG. 3E illustrates the bonding of the donor substrate to the receiver substrate, the layers 13 and 22 (or 20 in the absence of the bonding layer 22) being at the bonding interface I. In the case in which the layer 20 is present and made of a dielectric material, it forms, along with the dielectric layer 13, the buried insulating layer of the final strained semiconductor-on-insulator substrate. In the following figures, the layers 22 and 13 are nonetheless shown individually.

Figure 3F:
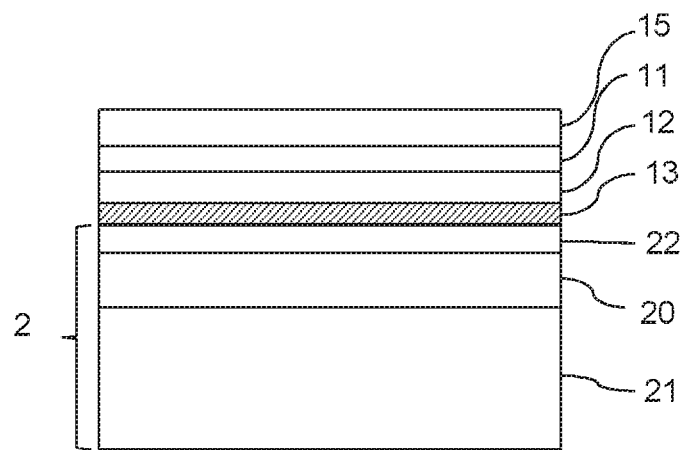

FIG. 3F illustrates the structure obtained after detaching the donor substrate along the weakened zone, the portion 15 of the carrier substrate being on the surface of the structure.

Alternatively, if the SMART CUT® method is not used, the structure may be obtained by thinning the back face of the donor substrate up to the layer 15 and smoothing the surface of the layer.

Figure 3G:
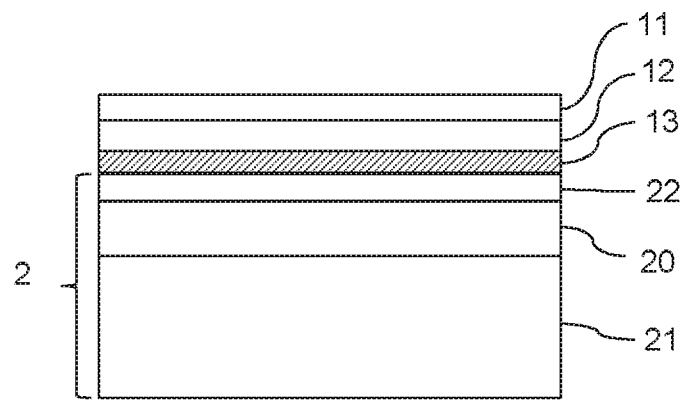

FIG. 3G illustrates the structure obtained after selectively etching the portion 15 of the carrier substrate, the intermediate layer 11 being located on the surface of the structure.

Figure 3H:
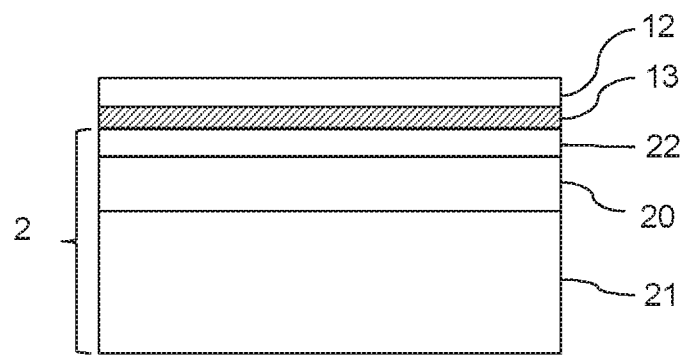

FIG. 3H illustrates the structure obtained after selectively etching the intermediate layer 11, the monocrystalline layer 12 being located on the surface of the structure.

Figure 3I:
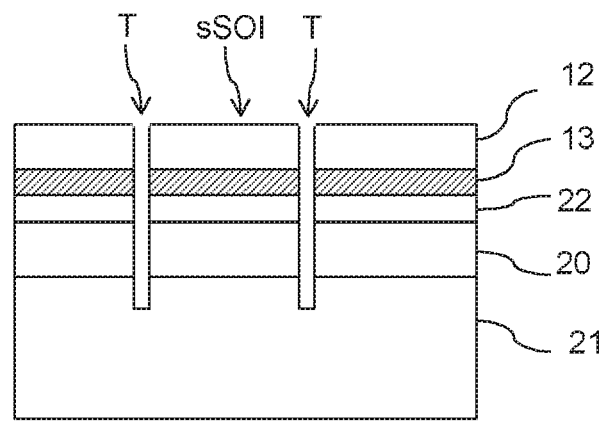

FIG. 3I illustrates the sSOI substrate obtained after cutting trenches T around the stack of layers 12, 13, 22, 20 up to within the thickness of the base substrate 21.

FIGS. 4A to 4I schematically illustrate steps of the fabrication of a strained semiconductor-on-insulator substrate according to another form of execution of the disclosure.

The elements denoted by the same references as in FIGS. 3A to 3I are of the same nature and as such are not described again.

Figure 4A:
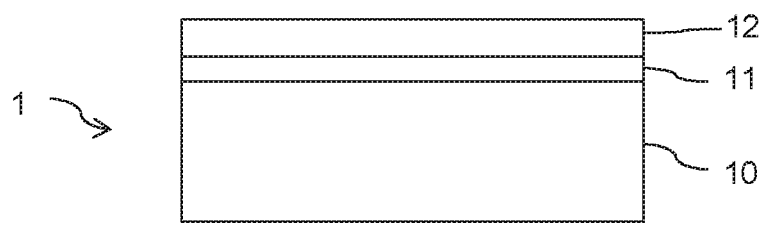
FIGS. 4A to 4I schematically illustrate steps of a method for fabricating a strained semiconductor-on-insulator substrate according to a second embodiment of the disclosure.
Figure 4B:
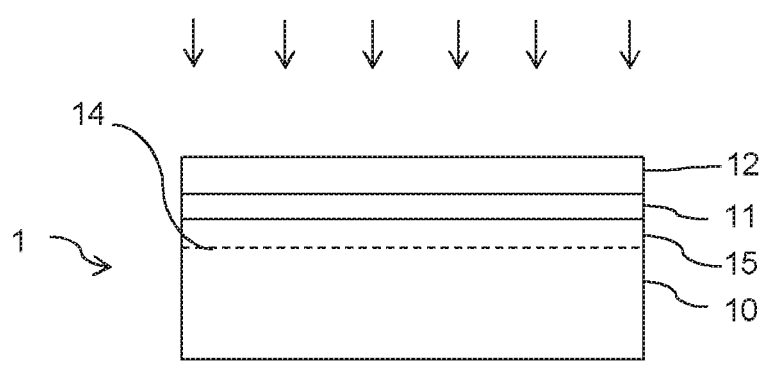
Figure 4C:
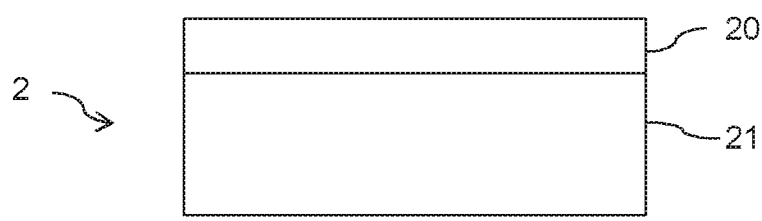

The steps illustrated in FIGS. 4A to 4C are similar to those of FIGS. 3A to 3C, except in that the donor substrate 1 is not covered by a dielectric layer. Stated otherwise, it is the semiconductor surface of the layer 12 to be transferred that is exposed.

Figure 4D:
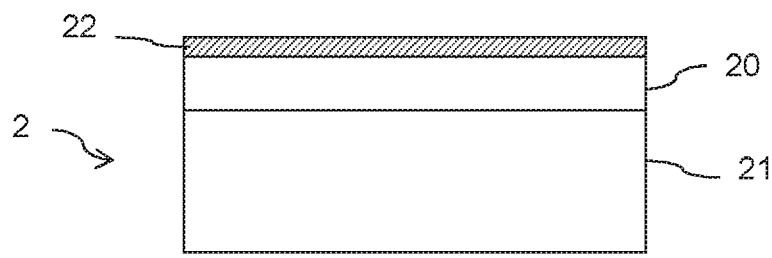
Figure 4E:
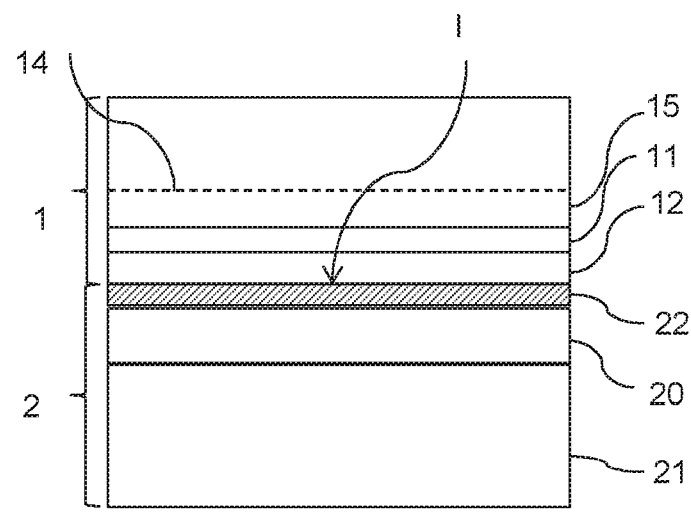
Figure 4F:
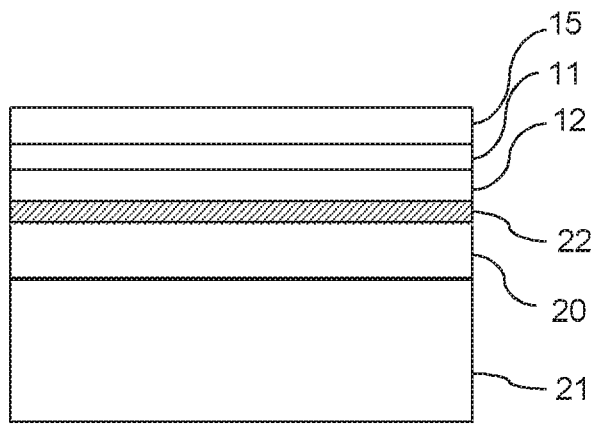
Figure 4G:
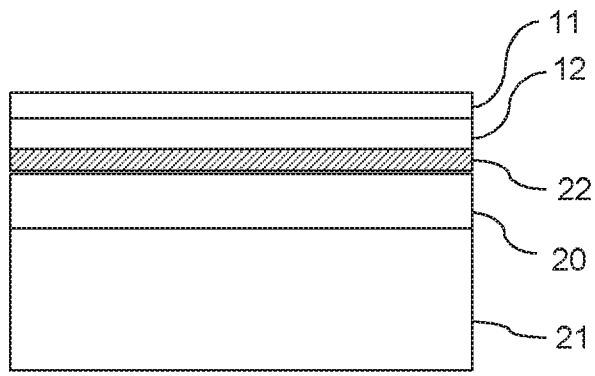
Figure 4H:
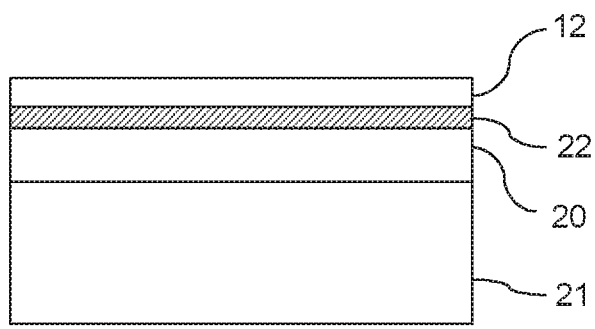
Figure 4I:
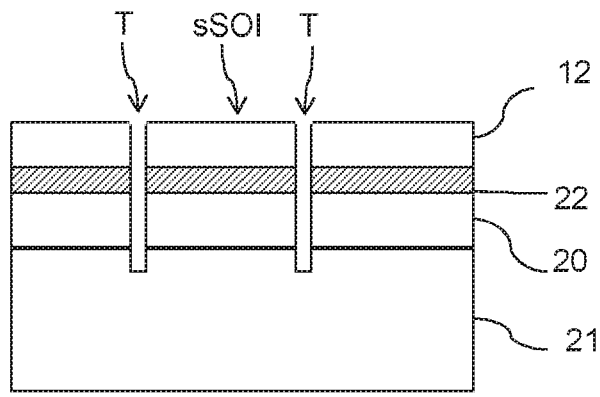

FIG. 4D illustrates the formation of a bonding layer 22 which, in this case, consists of a dielectric material deposited on the strained semiconductor material layer 20 of the receiving substrate 2.

The steps illustrated in FIGS. 4E to 4I are similar to those of FIGS. 3E to 3I, except in that the buried insulating layer of the sSOI substrate consists of the single bonding layer 22.

Lastly, it goes without saying that the examples given above are only particular illustrations that are in no way limiting with respect to the fields of application of the disclosure.

The invention claimed is:

1. A method for fabricating a strained semiconductor-on-insulator substrate, the method comprising:
   (a) providing a donor substrate comprising a monocrystalline semiconductor layer;
   (b) providing a receiving substrate comprising a surface layer of a strained monocrystalline semiconductor material;
   (c) bonding the donor substrate to the receiving substrate, a dielectric layer being at an interface therebetween;
   (d) transferring the monocrystalline semiconductor layer from the donor substrate to the receiving substrate, the transferring comprising the transfer, to the receiving substrate, of the monocrystalline semiconductor layer, an intermediate layer, and a portion of the donor substrate to the receiving substrate; and
   (e) cutting, by forming trench isolations extending into the receiving substrate beyond the strained monocrystalline semiconductor material layer, a portion from a stack formed from the transferred monocrystalline semiconductor layer, from the dielectric layer and from the strained monocrystalline semiconductor material layer, the cutting resulting in relaxation of the strain in the strained monocrystalline semiconductor material, and in application of at least a part of the strain to the transferred monocrystalline semiconductor layer;
   wherein the donor substrate provided in step (a) comprises, in succession, a monocrystalline carrier substrate, an intermediate layer and the monocrystalline semiconductor layer, the intermediate layer forming an etch-stop layer with respect to the carrier substrate material and to material of the monocrystalline semiconductor layer; and wherein between steps (d) and (e), the portion of the carrier substrate is selectively etched with respect to the intermediate layer and the intermediate layer is selectively etched with respect to the monocrystalline semiconductor layer.

2. The method of claim 1, wherein providing the donor substrate comprises epitaxially forming the intermediate layer on the monocrystalline carrier substrate, and then epitaxially forming the monocrystalline semiconductor layer on the intermediate layer.

3. The method of claim 2, wherein the carrier substrate comprises a first material that is identical to that of the monocrystalline semiconductor layer and the intermediate layer comprises a second material that differs from the first material, a thickness of the intermediate layer being chosen so that the second material retains a lattice parameter of the first material.

4. The method of claim 1, wherein the monocrystalline semiconductor layer is made of silicon and the intermediate layer is made of silicon-germanium.

5. The method of claim 1, wherein a thickness of the intermediate layer is between 5 nm and 20 nm.

6. The method of claim 1, wherein the strained monocrystalline semiconductor material layer comprises silicon-germanium.

7. The method of claim 6, wherein the strained monocrystalline semiconductor material layer is formed by epitaxy on a base substrate made of silicon.

8. The method of claim 1, wherein, upon completion of step (d), a thickness of the dielectric layer between the transferred monocrystalline semiconductor layer and the strained monocrystalline semiconductor material layer is less than or equal to 50 nm.

9. The method of claim 1, wherein step (a) comprises implanting ionic species into the donor substrate so as to form a weakened zone in the carrier substrate, and step (d) comprises detachment of the donor substrate along the weakened zone so as to transfer the monocrystalline semiconductor layer, the intermediate layer and the portion of the carrier substrate to the receiving substrate.

10. The method of claim 1, wherein:

step (b) further comprises forming, on the strained monocrystalline semiconductor material layer of the receiving substrate, a dielectric bonding layer or ea bonding layer consisting of the same relaxed monocrystalline material as the monocrystalline semiconductor layer of the donor substrate; and in step (c), the bonding layer is at the bonding interface between the donor substrate and the receiving substrate.

11. The method of claim 10, wherein the donor substrate comprises a first dielectric layer on the monocrystalline semiconductor layer.

12. The method of claim 11, wherein the bonding layer formed on the receiving substrate is a second dielectric layer, the first dielectric layer and second dielectric layer together forming a buried electrically insulating layer of the strained semiconductor-on-insulator substrate.

13. The method of claim 10, wherein the bonding layer comprises an oxide or a nitride of a semiconductor material.

14. The method of claim 12, wherein the bonding layer is formed by deposition on the strained monocrystalline semiconductor material layer of the receiving substrate.

15. The method of claim 12, wherein a thickness of the bonding layer is between 1 and 30 nm.

16. The method of claim 10, wherein the bonding layer is formed by epitaxial deposition of the same semiconductor material as the monocrystalline semiconductor layer on the strained semiconductor material layer.

17. The method of claim 16, wherein a thickness of the bonding layer is between 1 nm and 20 nm.

18. The method of claim 8, wherein, upon completion of step (d), a thickness of the dielectric layer between the transferred monocrystalline semiconductor layer and the strained monocrystalline semiconductor material layer is less than or equal to 25 nm.

* * * * *

UNITED STATES PATENT AND TRADEMARK OFFICE
CERTIFICATE OF CORRECTION

PATENT NO. : 10,957,577 B2
APPLICATION NO. : 16/301276
DATED : March 23, 2021
INVENTOR(S) : Walter Schwarzenbach, Guillaume Chabanne and Nicolas Daval Page 1 of 1

It is certified that error appears in the above-identified patent and that said Letters Patent is hereby corrected as shown below:

In the Claims
Claim 10, Column 12, Line 7, change "or ea" to --or a--

Signed and Sealed this
First Day of June, 2021

Drew Hirshfeld
*Performing the Functions and Duties of the*
*Under Secretary of Commerce for Intellectual Property and*
*Director of the United States Patent and Trademark Office*